(12) United States Patent
Kim

(10) Patent No.: US 7,433,240 B2
(45) Date of Patent: Oct. 7, 2008

(54) PAGE BUFFER CIRCUIT OF FLASH MEMORY DEVICE WITH DUAL PAGE PROGRAM FUNCTION AND PROGRAM OPERATION METHOD THEREOF

(75) Inventor: Byung Ryul Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 155 days.

(21) Appl. No.: 11/479,342

(22) Filed: Jun. 30, 2006

(65) Prior Publication Data
US 2007/0035999 A1 Feb. 15, 2007

(30) Foreign Application Priority Data
Aug. 9, 2005 (KR) .................... 10-2005-0072667

(51) Int. Cl.
*G11C 11/34* (2006.01)
(52) U.S. Cl. ............... 365/185.23; 365/185.11; 365/185.17; 365/185.18; 365/185.22; 365/185.21
(58) Field of Classification Search ............ 365/185.11, 365/185.17, 185.18, 185.22, 185.23, 185.21
See application file for complete search history.

(56) References Cited

U.S. PATENT DOCUMENTS 5,748,538 A * 5/1998 Lee et al. ............... 365/185.06
5,969,543 A * 10/1999 Erickson et al. ............... 326/83
6,272,586 B1 * 8/2001 Roohparvar et al. ......... 711/103
6,295,227 B1 * 9/2001 Sakui et al. ............ 365/185.17
6,600,676 B2 * 7/2003 Shibata et al. ......... 365/185.04
7,177,196 B2 * 2/2007 Takeuchi et al. ........ 365/185.22
2004/0071018 A1 * 4/2004 Nordal et al. ................ 365/200
2004/0240273 A1 * 12/2004 Sakui ..................... 365/185.33
2006/0104112 A1 * 5/2006 Hosono et al. ......... 365/185.01

FOREIGN PATENT DOCUMENTS

| JP | 10-134588 | 5/1998 |
|---|---|---|
| KR | 10-2002-0092261 A | 12/2002 |
| KR | 10-2006-0005603 A | 1/2006 |
| KR | 10-2006-0031989 A | 4/2006 |

OTHER PUBLICATIONS

Ken Takeuchi and Tomoharu Tanaka, A Dual Programming Scheme for High-Speed Multi-Gb-Scale NAND Flash Memories, Jun. 2000, 2000 Sumposium on VLSI Circuits Digest of Technical Papers, pp. 156-157.*

Ken Takeuchi and Tomocharu Tanaka, A Dual-Page Programming Scheme for High-Speed Multigigabit-Scale NAND Flash Memories, IEEE Journal of Solid-State Circuits, Issue 5, May 2001, pp. 744-751.*

* cited by examiner

*Primary Examiner*—Huan Hoang
*Assistant Examiner*—Jay Radke
(74) *Attorney, Agent, or Firm*—Townsend and Townsend and Crew LLP

(57) ABSTRACT

A flash memory device has a page buffer circuit that has a dual page program function. The page buffer circuit is coupled to at least one pair of first bit lines and at least one pair of second bit lines.

14 Claims, 9 Drawing Sheets

PAGE BUFFER CIRCUIT OF FLASH MEMORY DEVICE WITH DUAL PAGE PROGRAM FUNCTION AND PROGRAM OPERATION METHOD THEREOF

BACKGROUND

The present invention relates to flash memory devices, and more particularly, to a page buffer circuit of a flash memory device and program operation method thereof.

In general, a page buffer circuit included in a flash memory device programs a large quantity of data into a memory cell block or reads a large quantity of data from a memory cell block during a short period of time. In the program operation of a conventional page buffer circuit, one page can be programmed at once. The program operation of the conventional page buffer circuit will be described below in short with reference to FIG. 1.

Referring to FIG. 1, at step 11, data to be programmed are input to the page buffer circuit. At step 12, the page buffer circuit selects a bit line. When a program voltage is supplied to a selected word line, the page buffer circuit outputs the program data to the selected bit line (step 13). At step 14, a program verify step is performed and a check is performed to determine whether the program has been completed (step 15).

If the program has not been completed, steps 13 to 15 are repeated. If the program has been completed, a check is performed to determine whether the page that has been programmed is the last page (step 16). If the page that has been programmed is not the last page, steps 11 to 16 are repeated. In step 13, a next word line is selected. If the page that has been programmed is the last page, the page buffer circuit stops the program operation (step 17).

As described above, in the program operation of the conventional page buffer circuit, one page can be programmed at once. In other words, after the program and verify processes for one page are completed, the program and verify processes for a next page can be executed. Accordingly, the program operation of the conventional page buffer circuit is problematic in that it increases the whole program time of the flash memory device. It is desirable to improve the operation performance of the flash memory device.

SUMMARY OF THE INVENTION

An embodiment of the present invention relates to a page buffer circuit of a flash memory device, wherein a program time can be shortened by programming multiple pages (e.g., dual pages) at substantially the same time.

Another embodiment of the present invention relates to a program operation method of a page buffer circuit, wherein a program time can be shortened by programming dual pages at substantially the same time.

In accordance with an embodiment of the present invention, a page buffer circuit of a flash memory device is respectively connected to at least one pair of first bit lines and at least one pair of second bit lines. The pair of first bit lines are connected to first memory cells of a first memory cell block, and the pair of second bit lines are connected to second memory cells of a second memory cell block. A first bit line select circuit selects one of the first bit lines in response to first discharge signals and first bit line select signals and connects the selected first bit line to a sensing node. A second bit line select circuit selects one of the second bit lines in response to second discharge signals and second bit line select signals and connects the selected second bit line to the sensing node. A sensing circuit senses a voltage of the sensing node in response to a latch control signal and generates sensing data to a first node according to the sensing result. A latch circuit latches the sensing data or input data. A program control circuit outputs the input data, which are received from the latch circuit, to the first or second bit line connected to the sensing node in response to a first program control signal. A verify circuit generates verify data in response to a verify control signal and the sensing data received from the latch circuit. In this case, when the first bit line select circuit connects one of the first bit lines to the sensing node, the second bit line select circuit separates all the second bit lines from the sensing node.

According to an embodiment of the present invention, a program operation method of a page buffer circuit of a flash memory device including first and second memory cell blocks, includes: storing first input data in a latch circuit; when a program voltage is applied to a first word line connected to a first memory cell included in the first memory cell block, loading the first input data onto a first bit line connected to the first memory cell through a sensing node; when the first input data are loaded onto the first bit line, storing second input data in the latch circuit; when the program voltage is applied to a second word line connected to a second memory cell included in the second memory cell block, loading the second input data onto a second bit line connected to the second memory cell through the sensing node; generating first verify data for verifying whether the first memory cell has been programmed; and generating second verify data for verifying whether the second memory cell has been programmed.

BRIEF DESCRIPTION OF THE DRAWINGS

A more complete appreciation of the invention will be readily apparent by reference to the following detailed description when considered in conjunction with the accompanying drawings in which like reference symbols indicate substantially the same or similar components, wherein.

DETAILED DESCRIPTION OF EMBODIMENTS

Figure 1:
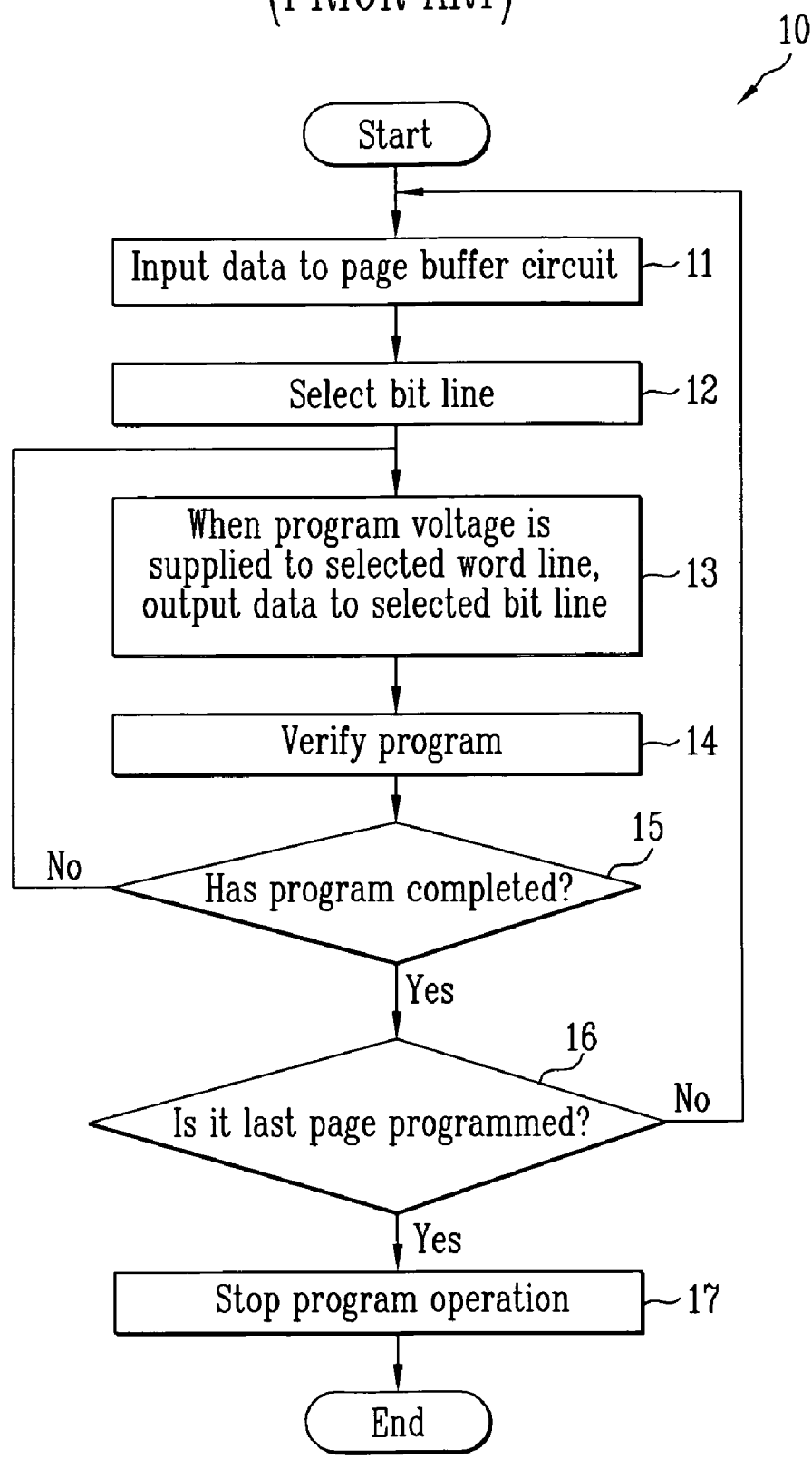
FIG. 1 is a flowchart illustrating a program operation of a conventional page buffer circuit of a flash memory device.

In the following detailed description, only certain exemplary embodiments of the present invention have been shown and described simply by way of illustration. As those skilled in the art will realize, the described embodiments may be modified in various different ways, all without departing from the spirit or scope of the present invention. Accordingly, the drawings and description are to be regarded as illustrative in nature and not restrictive. Like reference numerals designate like elements.

Figure 2:
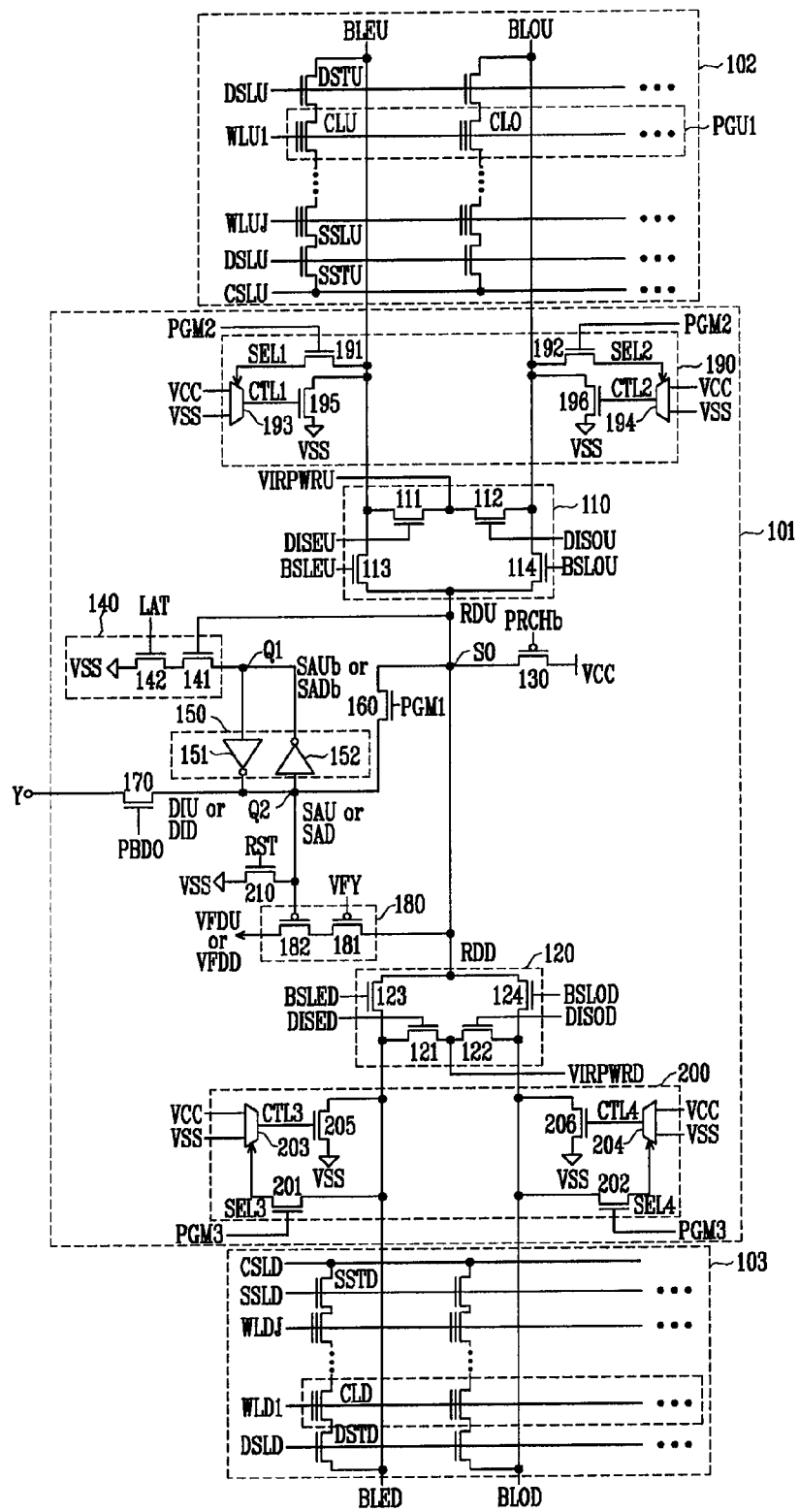
FIG. 2 is a circuit diagram of a page buffer circuit and memory cell blocks according to an embodiment of the present invention.

FIG. 2 is a circuit diagram of a page buffer circuit and memory cell blocks according to an embodiment of the present invention.

Referring to FIG. 2, the page buffer circuit 101 is connected to bit lines BLEU, BLOU, BLED, and BLOD of memory cell blocks 102, 103. The memory cell blocks 102, 103 have a symmetrical structure centering around the page buffer circuit 101. Since the memory cell blocks 102, 103 have substantially the same construction in the present implementation, only the memory cell block 102 will be described as an example. For illustrative convenience, the memory cell block 102 will be referred to as an "upper memory block" and the memory cell block 103 will be referred to as a "lower memory block".

The upper memory block 102 includes memory cells CLU and CLO connected to the bit lines BLEU, BLOU and word lines WLU1 to WLUJ (J is an integer), respectively. In FIG. 2, for simplification of the drawing, only the bit lines BLEU, BLOU of the upper memory block 102 are shown and additional bit lines have been omitted. The upper memory block 102 further includes a drain select transistors DSTU connected to a drain select line DSLU, and a source select transistors SSTU connected to a source select line SSLU. In the upper memory block 102, the memory cells to the same word lines (for example, the memory cells CLU connected to WLU1) form one page PGU1.

The page buffer 101 includes bit line select circuits 110, 120, a precharge circuit 130, a sensing circuit 140, a latch circuit 150, a program control circuit 160, a data input circuit 170, a verify circuit 180, and voltage sustain circuits 190, 200.

The bit line select circuit 110 selects one of the bit lines BLEU, BLOU in response to discharge signal (DISEU, DISOU) and bit line select signals (BSLEU, BSLOU) and connects the selected bit line BLEU or BLOU to a sensing node SO. The bit line select circuit 110 includes NMOS transistors 111 to 114. The operation of each of the NMOS transistors 111 to 114 is well known to those skilled in the art. Description thereof will be omitted.

The bit line select circuit 120 includes NMOS transistors 121 to 124. The operation of the bit line select circuit 120 is similar to that of the bit line select circuit 110. For example, when the bit line select circuit 110 connects one of the bit lines BSLEU, BSLOU to the sensing node SO, the bit line select circuit 120 separates bit lines BSLED, BSLOD from the sensing node SO.

The precharge circuit 130 precharges the sensing node SO to an internal voltage (VCC) in response to a precharge control signal (PRCHb).

The sensing circuit 140 includes NMOS transistors 141, 142. The sensing circuit 140 senses a voltage of the sensing node SO in response to a latch control signal (LAT) and generates sensing data (SAUb or SADb) to a node Q1 according to the sensing result.

The latch circuit 150 latches the sensing data (SAUb or SADb) received through a node Q1 in a read operation, and latches input data (DIU or DID) received through a node Q2 in a program operation. The latch circuit 150 includes inverters 151, 152 that are connected to the nodes Q1, Q2 in reverse order.

The program control circuit 160 outputs the input data (DIU or DID), which are received from the latch circuit 150 through the node Q2, to the first or second bit line (one of BLEU and BLOU, or one of BLED and BLOD) connected to the sensing node SO in response to a program control signal (PGM1). The program control circuit 160 may be implemented using an NMOS transistor.

The data input circuit 170 outputs input data (DIU or DID), which are received through a data I/O node Y, to the latch circuit 150 in response to an input control signal.

The verify circuit 180 generates first or second verify data (VFDU or VFDD) in response to a verify control signal (VFY) and sensing data (SAU or SAD) which are received from the latch circuit 150 through the node Q2. The verify circuit 180 includes switching circuits 181, 182. Each of the switching circuits 181, 182 may be implemented using a PMOS transistor. The switching circuits 181, 182 are connected in series to the sensing node SO. The switching circuit 181 is turned on or off in response to the verify control signal (VFY) and the switching circuit 182 is turned on or off in response to the sensing data (SAU or SAD). When the switching circuits 181, 182 are turned on at the same time, the switching circuit 182 outputs the first or second verify data (VFDU or VFDD) having a voltage level of the sensing node SO.

The voltage sustain circuit 190 includes switching circuits 191, 192, multiplexers 193, 194, and discharge circuits 195, 196. Each of the switching circuits 191, 192 and each of the discharge circuits 195, 196 may be implemented using an NMOS transistor.

The switching circuit 191 is connected to the bit line BLEU and outputs a select signal (SEL1) having a voltage level of the bit line BLEU in response to a program control signal (PGM1) in the program operation. The multiplexer 193 outputs a control signal (CTL1) of the internal voltage (VCC) or the ground voltage (VSS) level in response to the select signal (SEL1). The discharge circuit 195 discharges the bit line BLEU to the ground voltage (VSS) or stops the discharge operation in response to the control signal (CTL1).

The switching circuit 192 is connected to the bit line BLOU and outputs a select signal (SEL2) having a voltage level of the bit line BLOU in response to a program control signal (PGM2) in the program operation. The multiplexer 194 outputs a control signal (CTL2) of the internal voltage (VCC) or the ground voltage (VSS) level in response to the select signal (SEL2). The discharge circuit 196 discharges the bit line BLOU to the ground voltage (VSS) or stops the discharge operation in response to the control signal (CTL2).

The voltage sustain circuit 200 includes switching circuits 201, 202, multiplexers 203, 204, and discharge circuits 205, 206. The construction and operation of the voltage sustain circuit 200 are substantially the same to those of the voltage sustain circuit 190. Description thereof will be omitted.

The latch reset circuit 210 initializes the latch circuit 150 by discharging the node Q2 to the ground voltage (VSS) in response to a reset control signal (RST).

The program operation of the page buffer circuit 101 will be described below in a detailed manner with reference to FIGS. 3 to 8. In the present embodiment, for convenience of explanation, an example in which the memory cell (or the first memory cell) CLU of the upper memory block 102 is programmed, and the memory cell (or the second memory cell) CLD of the lower memory block 103 is programmed will be described. Furthermore, the bit line BLEU and the word line WLU1 connected to the memory cell CLU will be referred to as a "first bit line" and a "first word line", respectively. The bit line BLED and the word line WLD1 connected to the memory cell CLD will be referred to as a "second bit line" and a "second word line". In addition, the program control signal (PGM1) will be referred to as a "first program control signal" and the program control signals (PGM2, PGM3) will be referred to as a "second program control signal".

Figure 3:
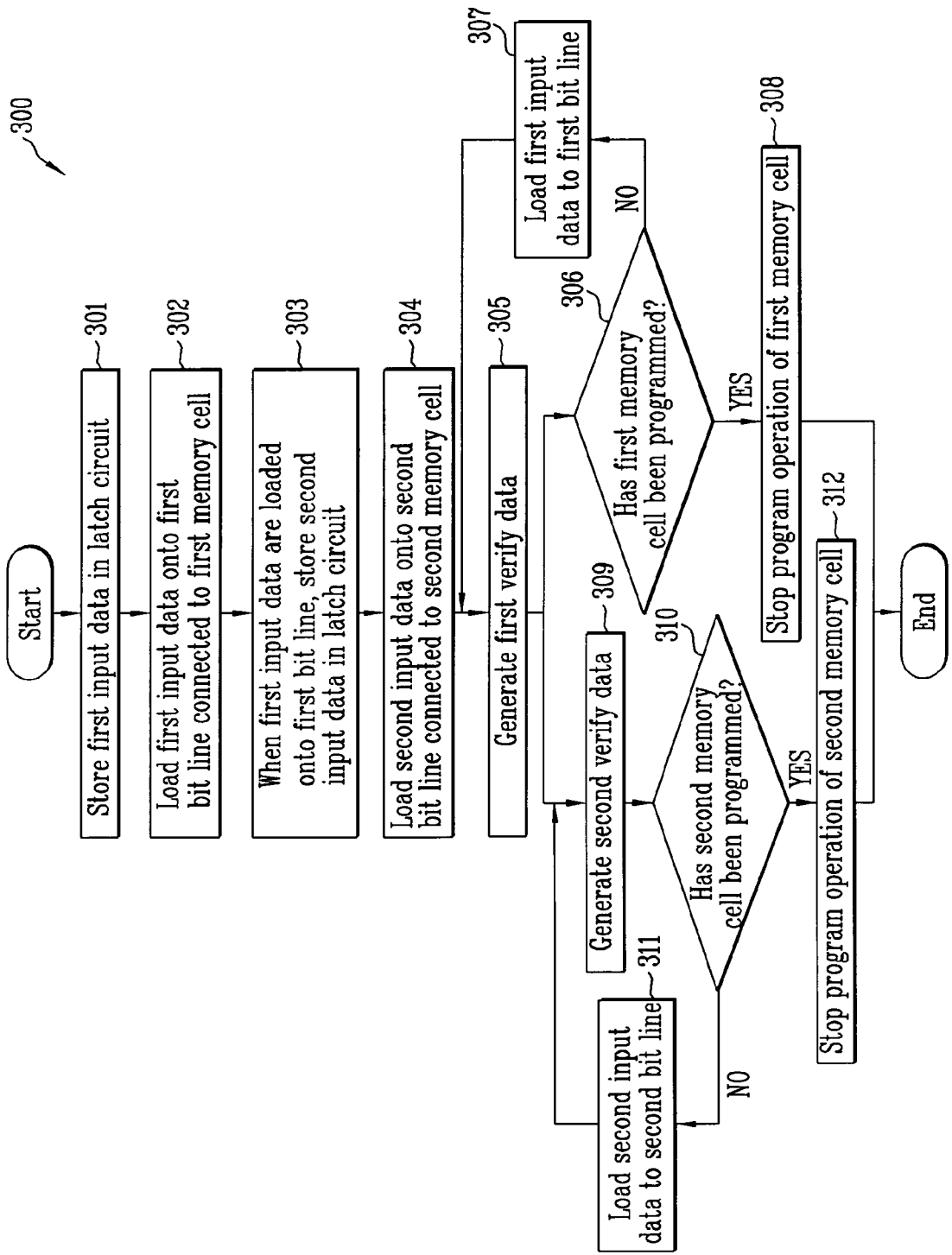
FIG. 3 is a flowchart illustrating a program operation of the page buffer circuit according to an embodiment of the present invention.
Figure 8:
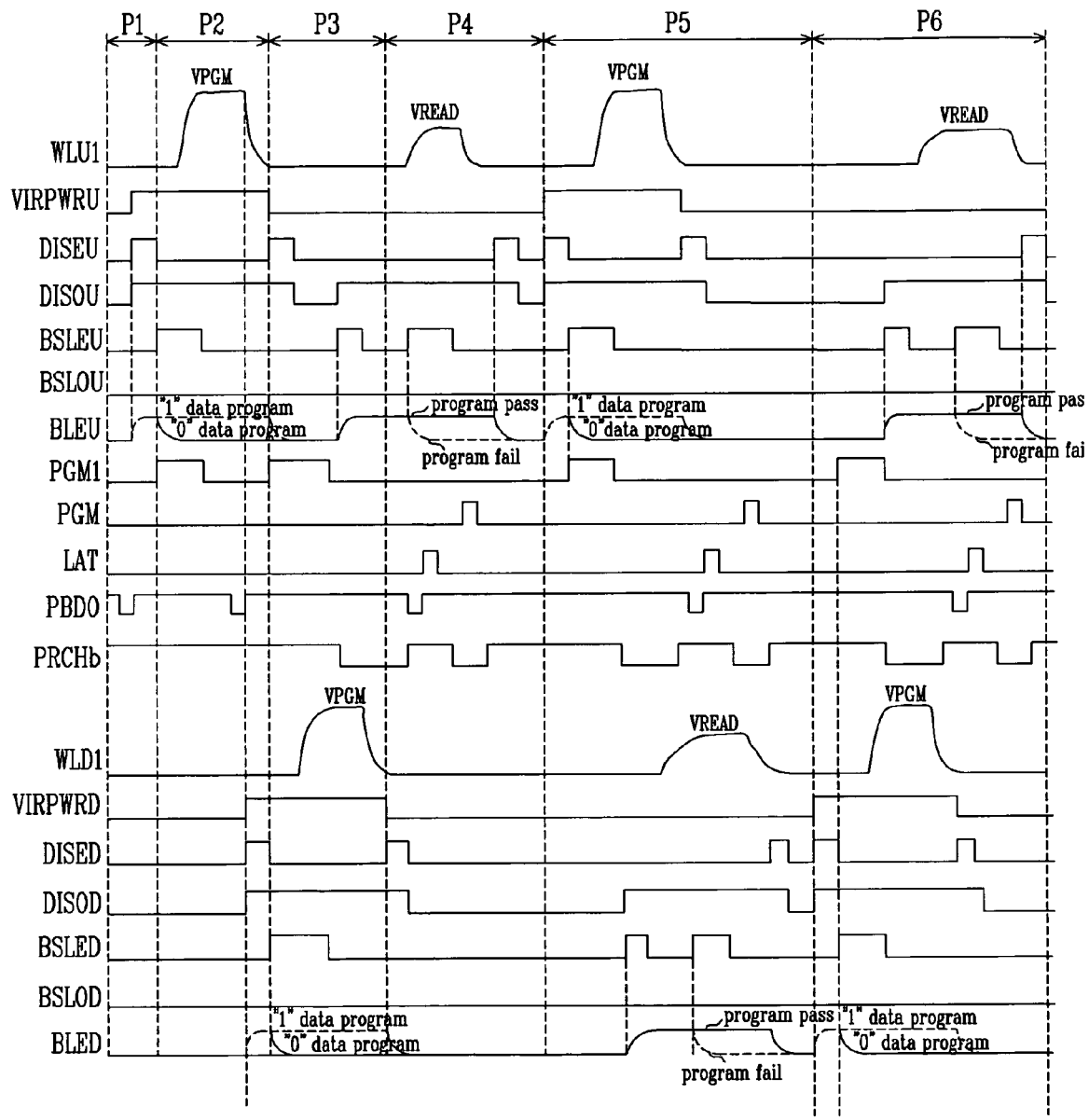
FIG. 8 is a timing diagram of signals related to the program operation of the page buffer circuit shown in FIG. 3.

Referring to FIGS. 3 and 8, at step 301 of FIG. 3, during a period (P1) in accordance with FIG. 8, the first input data (DIU) are stored in the latch circuit 150. This will be described in more detail. If an input control signal (PBDO) is enabled in the period (P1), the data input circuit 170 outputs the first input data (DIU) of logic "1" or "0", which are received through the I/O node Y, to the node Q2. As a result, the latch circuit 150 latches the first input data (DIU) received through the node Q2.

At step 302, if a program voltage (VPGM) is applied to the first word line WLU1 during a period (P2), the page buffer circuit 101 loads the first input data (DIU) onto the first bit line BLEU connected to the first memory cell CLU through the sensing node SO. Step 302 will be described below in more detail with reference to FIG. 4.

The discharge signal (DISEU) is enabled for a predetermined time and is then disabled. The discharge signal (DISOU) is enabled during the period (P2). Furthermore, a bit line control signal (VIRPWRU) becomes the internal voltage (VCC) level during the period (P2). As a result, the bit line select circuit 110 consecutively supplies the bit line control signal (VIRPWR) to the bit line BLOU in response to the discharge signals (DISEU, DISOU), thereby precharging the bit line BLOU to the internal voltage (VCC) level.

Furthermore, during the period (P2), the bit line select signal (BSLEU) is enabled for a set time and the bit line select signal (BSLOU) remains disabled. At step 321, the bit line select circuit 110 connects the first bit line BLEU to the sensing node SO in response to the bit line select signals (BSLEU, BSLOU). While the bit line select signal (BSLEU) is enabled, the first program control signal (PGM1) is enabled.

At step 322, the program control circuit 160 outputs the first input data (DIU), which are stored in the latch circuit 150, to the first bit line BLEU through the sensing node SO in response to the first program control signal (PGM1). When the program voltage (VPGM) is applied to the first word line WLU1, the bit line select signal (BSLEU) is disabled.

At step 323, the bit line select circuit 110 separates the first bit line BLEU from the sensing node SO in response to the bit line select signal (BSLEU). When the first bit line BLEU is separated from the sensing node SO, the voltage sustain circuit 190 maintains the voltage level of the first bit line BLEU to the voltage level of the first input data (DIU) in response to the second program control signal (PGM2) (step 324). This will be described below in more detail.

When the first bit line BLEU is supplied with the first input data (DIU), the second program control signal (PGM2) is enabled. The switching circuit 191 of the voltage sustain circuit 190 is turned on in response to the second program control signal (PGM2) and outputs the select signal (SEL1) having a voltage (i.e., a voltage of the first input data (DIU)) level of the first bit line BLEU.

For example, when a voltage of the first bit line BLEU is the internal voltage (VCC) level (i.e., a logic value of the first input data (DIU) is "1"), the switching circuit 191 outputs the select signal (SEL1) as the internal voltage (VCC) level. Furthermore, when a voltage of the first bit line BLEU is the ground voltage (VSS) level (i.e., a logic value of the first input data (DIU) is "0"), the switching circuit 191 outputs the select signal (SEL1) as the ground voltage (VSS) level.

The multiplexer 193 of the voltage sustain circuit 190 generates the control signal (CTL1) of the internal voltage (VCC) or the ground voltage (VSS) level in response to the select signal (SEL1). When the select signal (SEL1) is the internal voltage (VCC) level, the multiplexer 193 outputs the control signal (CTL1) as the ground voltage (VSS) level. Furthermore, when the select signal (SEL1) is the ground voltage (VSS) level, the multiplexer 193 outputs the control signal (CTL1) as the internal voltage (VCC) level.

The discharge circuit 195 of the voltage sustain circuit 190 may discharge the first bit line BLEU to the ground voltage (VCC) or stop the discharge operation in response to the control signal (CTL1). For example, when the control signal (CTL1) is the ground voltage (VSS) level, the discharge circuit 195 does not operate. In contrast, when the control signal (CTL1) is the internal voltage (VCC) level, the discharge circuit 195 discharges the first bit line BLEU to the ground voltage (VCC).

When the first bit line BLEU is separated from the sensing node SO as described above, the voltage sustain circuit 190 maintains the voltage level of the first bit line BLEU to that of the first input data (DIU), in order to prevent data from being erroneously programmed into the first memory cell CLU. For example, in the case where after the first input data (DIU) are loaded onto the first bit line BLEU, the first memory cell CLU is programmed with the first bit line BLEU being separated from the sensing node SO (i.e., a floated state), so that the voltage level of the first bit line BLEU may be changed due to the influence of surrounding circuits.

In other words, when the first input data (DIU) of logic "0" are loaded onto the first bit line BLEU, the bit line BLOU is consecutively supplied with the internal voltage (VCC) in order to prevent a memory cell CLO, which is connected to the bit line BLOU, from being programmed. As a result, the voltage level of the first bit line BLEU rises and the first memory cell CLU is not programmed due to the coupling phenomenon between the first bit line BLEU and the bit line BLOU. Accordingly, when the first bit line BLEU is separated from the sensing node SO, the voltage level of the first bit line BLEU needs to be maintained at the voltage level of the first input data (DIU).

Referring back to FIG. 3, at step 303, when the first input data (DIU) are loaded onto the first bit line BLEU during the period (P2), the second input data (DID) are stored in the latch circuit 150. At step 303, the operation of the page buffer circuit 101 is substantially the same as that of step 301. Description thereof will be omitted.

At step 304, when the program voltage (VPGM) is applied to the second word line WLD1 connected to the second memory cell CLD during the period (P3), the page buffer circuit 101 loads the second input data (DID) onto the second bit line BLED through the sensing node SO. Step 304 will be described below in more detail with reference to FIG. 5.

Figure 4:
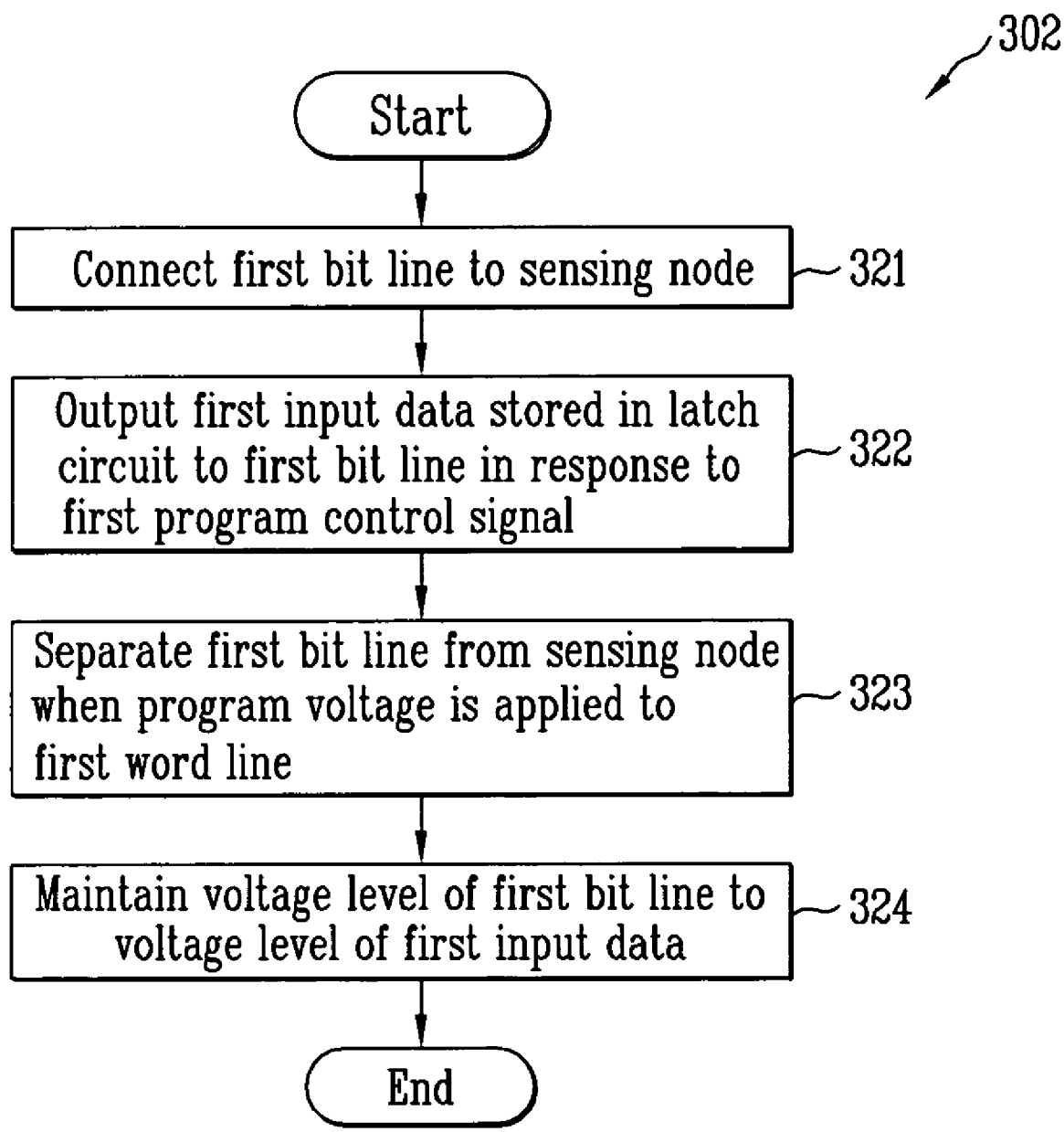
FIG. 4 is a detailed flowchart illustrating a processing procedure (step 302) shown in FIG. 3.
Figure 5:
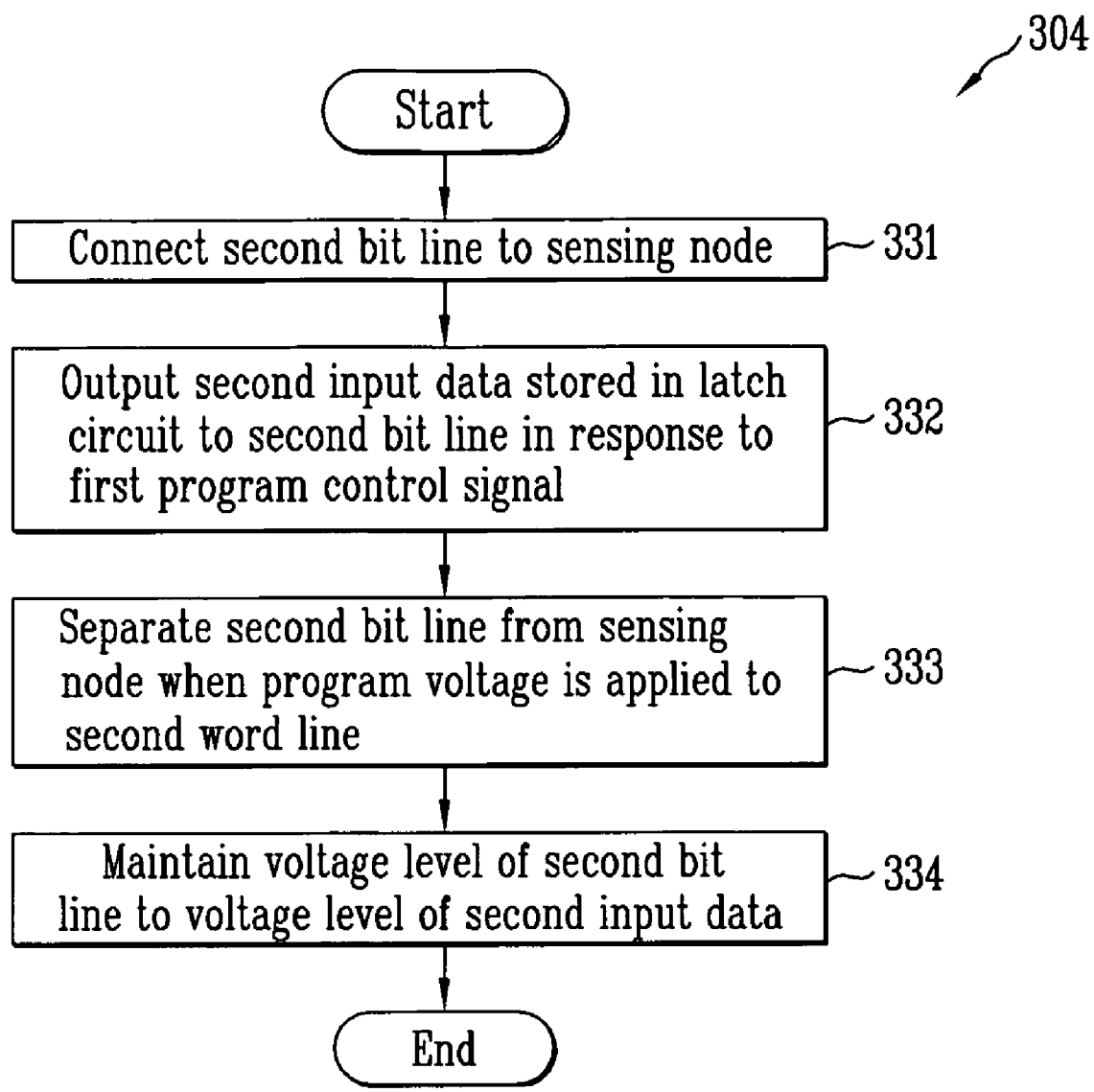
FIG. 5 is a detailed flowchart illustrating a processing procedure (step 304) shown in FIG. 3.

The processes of the step 304 shown in FIG. 5 is similar to those of the step 302 shown in FIG. 4 and will be thus described in short. At step 331, the bit line select circuit 120 connects the second bit line BLED to the sensing node SO in response to the discharge signals (DISED, DISOD) and the bit line select signals (BSLED, BSLOD).

At step 332, the program control circuit 160 outputs the second input data (DID), which are stored in the latch circuit 150, to the second bit line BLED through the sensing node SO in response to the first program control signal (PGM1).

At step 333, when the program voltage (VPGM) is applied to the second word line WLD1, the bit line select circuit 120 separates the second bit line BLED from the sensing node SO in response to the bit line select signal (BSLED).

At step 334, when the second bit line BLED is separated from the sensing node SO, the voltage sustain circuit 200 maintains a voltage level of the second bit line BLED to a voltage level of the second input data (DID) in response to the second program control signal (PGM3).

Referring back to FIG. 3, at step 305, during a period (P4), the page buffer circuit 101 generates the first verify data (VFDU) for verifying whether the first memory cell CLU has been completed. Step 305 will be described below in more detail with reference to FIG. 6.

The precharge control signal (PRCHb) is first disabled during a time (R1). At step 341, the precharge circuit 130 precharges the sensing node SO to the internal voltage (VCC) level in response to the precharge control signal (PRCHb). When the sensing node SO is precharged, the bit line select circuit 110 connects the first bit line BLEU to the sensing node SO. As a result, the first bit line BLEU is precharged to the internal voltage (VCC) level. Furthermore, the latch reset circuit 210 discharges the node Q2 to the ground voltage (VSS) in response to the reset control signal (RST), thereby initializing the latch circuit 150.

At step 342, during a period (P4), the first input data (DIU) are stored in the latch circuit 150. At step 343, during the period (P4), the bit line select circuit 110 connects the first bit line BLEU to the sensing node SO. Thereafter, when the first word line WLU1 is supplied with a verify voltage (VREAD), the latch control signal (LAT) is enabled for a set time. The sensing circuit 140 senses a voltage of the sensing node SO based on data (RDU) read from the first memory cell CLU in response to the latch control signal (LAT) and generates the sensing data (SAUb) according to the sensing result.

For example, in the case where the first memory cell CLU has been programmed (i.e., when the data (RDU) are logic "1"), the first bit line BLEU and the sensing node SO are maintained at the internal voltage (VCC) level. In this case, the sensing circuit 140 discharges the node Q1 to the ground voltage (VSS) in response to the latch control signal (LAT) and the data (RDU). As a result, the sensing data (SAUb) of logic "0" are generated from the node Q1. The latch circuit 150 latches (stores) the sensing data (SAUb) (step 344) and outputs an inverted sensing data (SAU) of logic "1" to the node Q1.

Meanwhile, in the case where the first memory cell CLU has not been programmed (i.e., when the data (RDU) are logic "0"), the first bit line BLEU and the sensing node SO are changed to the ground voltage (VSS) level. In this case, the sensing circuit 140 does not discharge the node Q1 to the ground voltage (VSS) in response to the latch control signal (LAT) and the data (RDU). Consequently, the latch circuit 150 is maintained at a state where the first input data (DIU) are stored. That is, the latch circuit 150 outputs the first input data (DIU) to the node Q2.

Thereafter, the precharge control signal (PRCHb) is disabled during a time (R2). When the precharge control signal (PRCHb) is disabled, the verify control signal (VFY) is disabled. The precharge circuit 130 precharges the sensing node SO to the internal voltage (VCC) level in response to the precharge control signal (PRCHb). At step 345, the verify circuit 180 generates the first verify data (VFDU) in response to the verify control signal (VFY) and the inverted sensing data (SAU) or the first input data (DIU).

For example, when the inverted sensing data (SAU) or the first input data (DIU) are logic "1", the switching circuit 182 of the verify circuit 180 is turned off and does not operate. A data line (not shown) along which the first verify data (VFDU) are transferred is initially a state where it is discharged to the ground voltage (VSS). Therefore, when the verify circuit 180 does not operate, the data line stays discharged. The first verify data (VFDU) is output as logic "0".

Furthermore, when the inverted sensing data (SAU) or the first input data (DIU) are logic "0", the switching circuit 182 of the verify circuit 180 is turned on. At this time, the switching circuit 181 is also turned on in response to the verify control signal (VFY). Accordingly, the verify circuit 180 outputs the first verify data (VFDU) having the voltage level (i.e., the internal voltage (VCC)) of the sensing node SO.

Consequently, if the first memory cell CLU has been programmed, the verify circuit 180 outputs the first verify data (VFDU) of logic "0". If the first memory cell CLU has not been programmed, the verify circuit 180 outputs the first verify data (VFDU) of logic "1".

Referring back to FIG. 3, at step 306, a data comparator (not shown) compares the first verify data (VFDU) output from the verify circuit 180 with reference data. Step 306 is performed to determine whether the first memory cell CLU has been programmed according to the comparison result.

If it is determined that the first memory cell CLU has been programmed, the program operation of the first memory cell CLU is stopped (step 308). If it is determined that the first memory cell CLU has not been programmed, the page buffer circuit 101 loads the first input data (DIU) onto the first bit line BLEU in substantially the same manner as the steps 302, 307 during a period (P5). Thereafter, steps 305, 306, and 307 are repeatedly executed until the first memory cell CLU is programmed.

At step 309, during the period (P5), the page buffer circuit 101 generates the second verify data (VFDD) for verifying whether the second memory cell CLD has been programmed. Step 309 will be described below in more detail with reference to FIG. 7.

Figure 6:
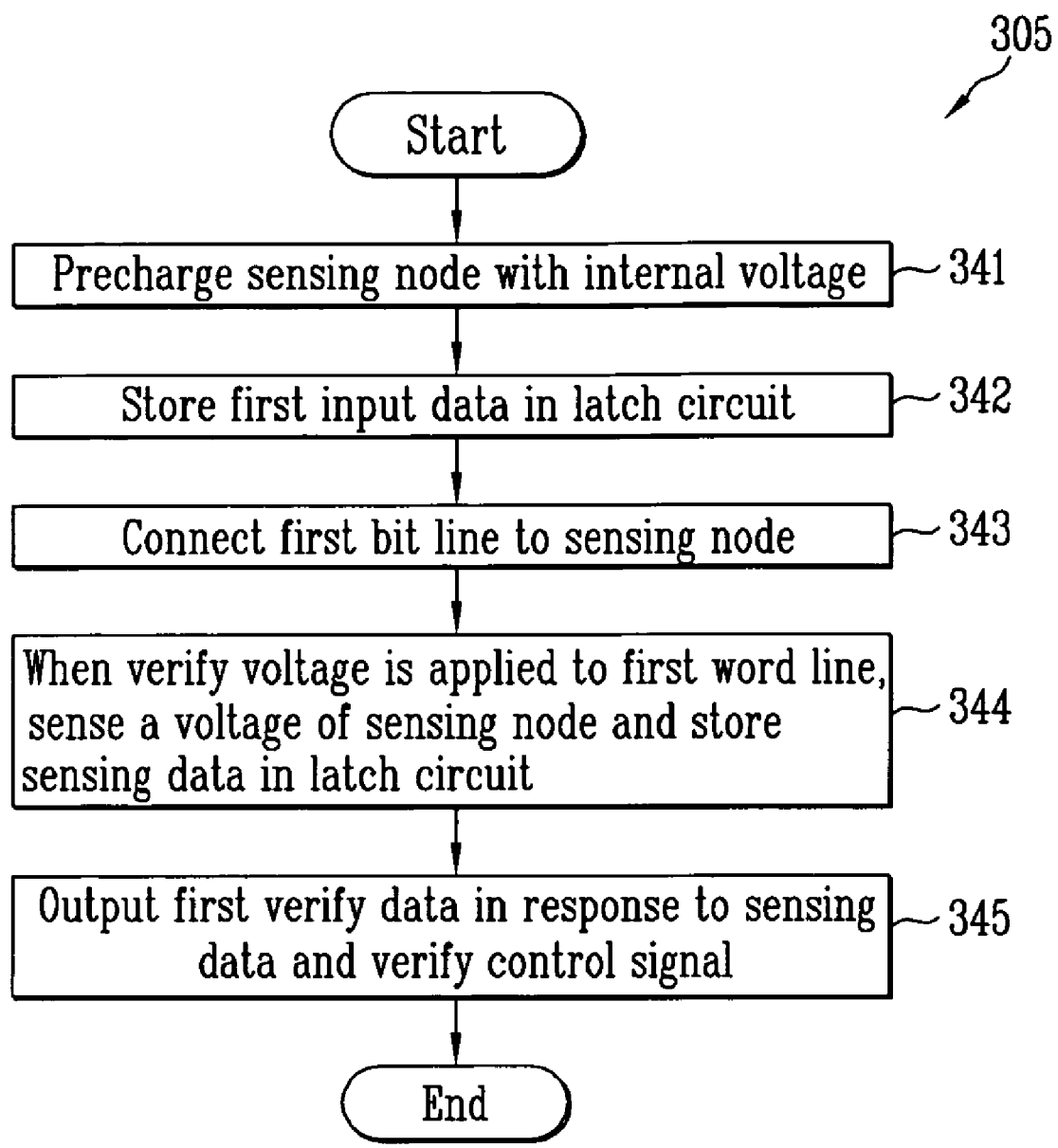
FIG. 6 is a detailed flowchart illustrating a processing procedure (step 305) shown in FIG. 3.
Figure 7:
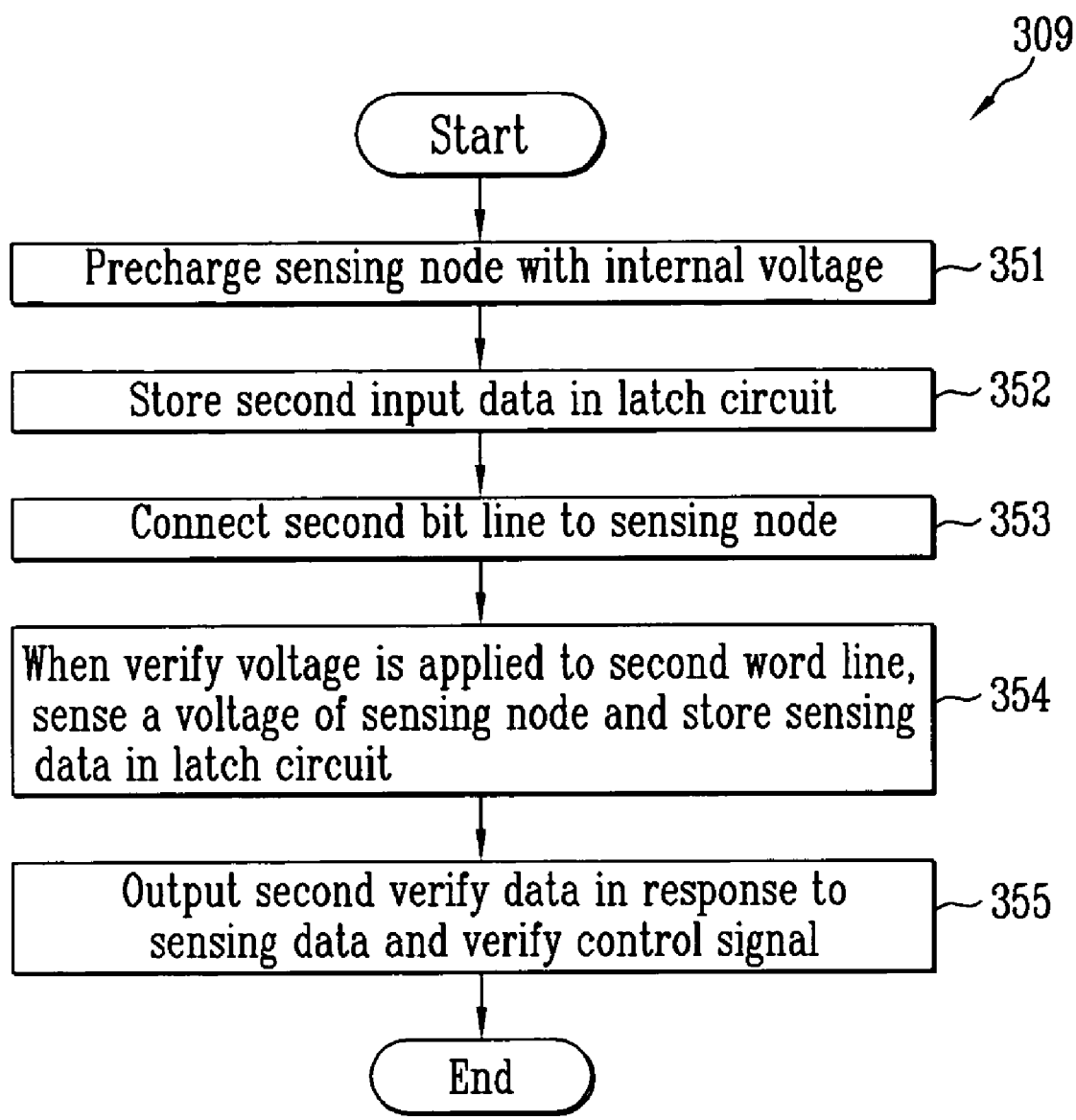
FIG. 7 is a detailed flowchart illustrating a processing procedure (step 309) shown in FIG. 3.

The processes of step 309 shown in FIG. 7 are similar to those of step 305 shown in FIG. 6 and will be thus described in short. At step 351, the precharge circuit 130 precharges the sensing node SO to the internal voltage (VCC) level in response to the precharge control signal (PRCHb). The second input data (DID) are then stored in the latch circuit 150 (step 352). At step 353, during the period (P5), the bit line select circuit 120 connects the second bit line BLED to the sensing node SO.

Thereafter, when the second word line WLD1 is supplied with the verify voltage (VREAD), the sensing circuit 140 senses a voltage of the sensing node SO, which is based on the data (RDD) read from the second memory cell CLD in response to the latch control signal (LAT) and generates the sensing data (SADb) according to the sensing result.

The latch circuit 150 latches (stores) the sensing data (SADb) (step 354) and outputs the inverted sensing data (SAD) to the node Q1. At step 355, the verify circuit 180 generates the second verify data (VFDD) in response to the verify control signal (VFY) and the inverted sensing data (SAD) (or the second input data (DID)).

Referring back to FIG. 3, at step 310, the second verify data (VFDD) generated from the verify circuit 180 are compared with the reference data by means of the data comparator. Step 310 is performed to determine whether the second memory cell CLD has been programmed according to the comparison result.

If it is determined that the second memory cell CLD has been programmed, the program operation of the second memory cell CLD is stopped (step 312). If it is determined that the second memory cell CLD has not been programmed, the page buffer circuit 101 loads the second input data (DID) onto the second bit line BLED in substantially the same manner as step 304 during a period (P6) (step 311). Thereafter, steps 309, 310, and 311 are repeatedly executed until the second memory cell CLD is programmed.

Alternatively, the page buffer circuit 101 may repeatedly perform the processes in the periods (P5, P6) until the first and second memory cells (CLU, CLD) are programmed. In more detail, the page buffer circuit 101 may execute an operation for loading the first input data (DIU) for programming the first memory cell CLU and an operation for generating the second verify data (VFDD) for verifying the second memory cell CLD at substantially the same time during the period (P5). Furthermore, the page buffer circuit 101 may perform an operation for loading the second input data (DID) for programming the second memory cell CLD and an operation for generating the first verify data (VFDU) for verifying the first memory cell CLU at substantially the same time during a period (P6).

As described above, in the page buffer circuit 101 and program operation method thereof, memory cells of one page included in the upper memory block 102 and memory cells of one page included in the lower memory block 103 are programmed at substantially the same time (i.e., memory cells of a dual page are programmed at substantially the same time). Accordingly, the whole program time can be shortened.

Figure 9:
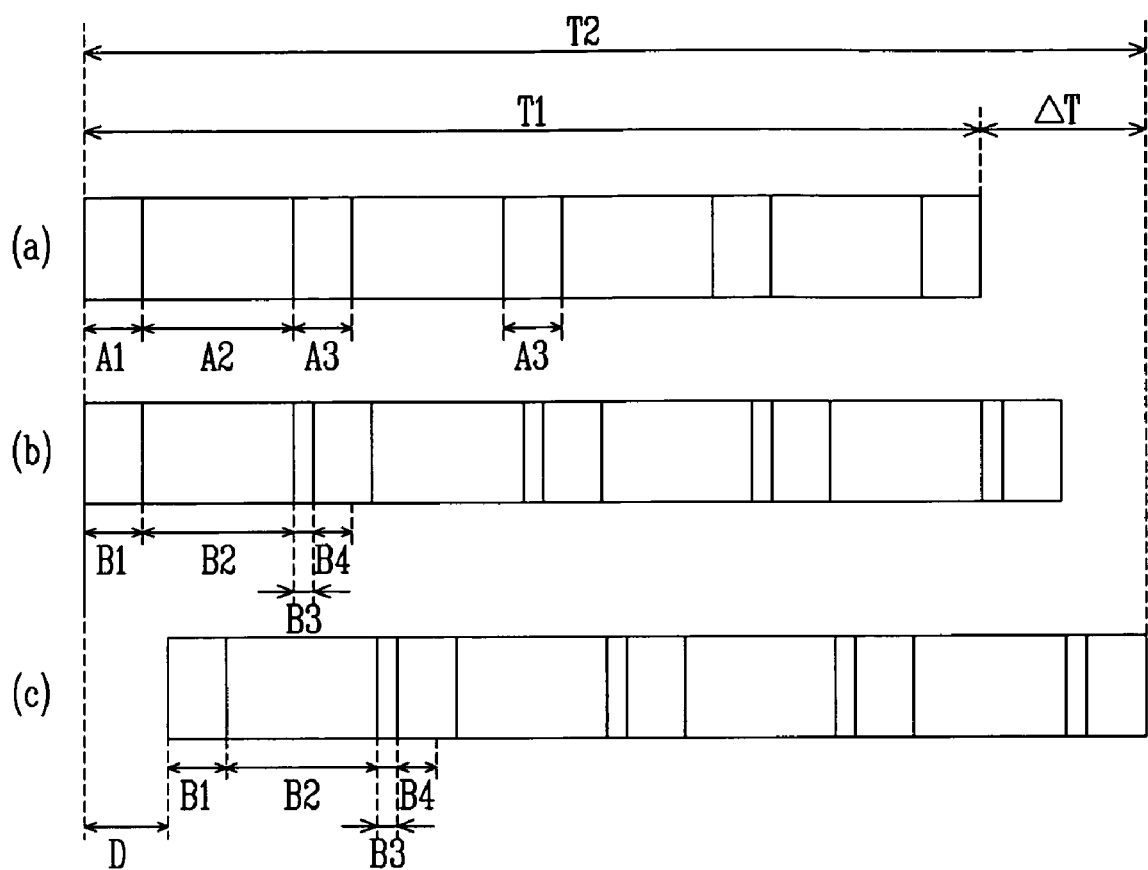
FIG. 9 is a view illustrating the comparison result between a program time according to the program operation of the page buffer circuit according to an embodiment of the present invention and a time taken when memory cells of a single page are programmed.

The advantage of an embodiment of the present invention will become clearer when referring to FIG. 9 showing the result of comparison between a time which is taken for memory cells of a dual page to be programmed and a time which is taken for memory cells of a single page to be programmed.

For convenience of explanation, FIG. 9 shows an example in which the memory cells of the single page and the memory cells of the dual page are respectively programmed during four program cycles. In FIG. 9, "(a)" conceptually shows a time which is taken for the memory cells of the single page to be programmed. "(b)" and "(c)" conceptually show a time which is taken for the memory cells of the dual page to be programmed. The whole program time (T1) which is taken for the memory cells of the single page to be programmed can be expressed in the following equation.

$$T1=(A1+A2+A3)\times 4 \quad \text{[Equation 1]}$$

In Equation 1, "A1" designates a time which is taken for the latch circuit and the bit line to be loaded, "A2" designate a program time and "A3" designates a program verify time.

Furthermore, the whole program time (T2) which is taken for the memory cells of the dual page to be programmed at substantially the same time can be expressed in the following equation.

$$T2=D+B1+[(B2+B3+B4)\times 4] \quad \text{[Equation 2]}$$

In Equation 2, "D" indicates a delay time from a time point at which the program operation of memory cells of a first page of the dual page begins to a time point at which the program operation of memory cells of a second page of the dual page begins. "B1" indicates a time which is taken for the latch circuit and the bit line to be loaded. "B2" indicates a program time. "B3" indicates a time which is taken for data to be loaded onto the latch circuit. "B4" indicates a program verify time.

As shown in FIG. 9, the time (T2) which is taken for the memory cells of the dual page to be programmed at substantially the same time is ΔT longer than the time (T1) which is taken for the memory cells of the single page to be programmed. However, it can be seen that the time (T2) is shorter than a time (2T1) which is taken for the memory cells of the two pages to be programmed since the memory cells are sequentially programmed on a page basis.

Accordingly, the whole program time of the memory cell block can be shortened when the dual pages are programmed at substantially the same time compared with when the memory cells are programmed on a single-page basis.

As described above, in accordance with the page buffer circuit of the flash memory device and program operation method thereof according to an embodiment of the present invention, the dual pages are programmed at substantially the same time. Accordingly, the whole program time of the memory cell block can be shortened.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A non-volatile memory device including a page buffer circuit coupled to at least one pair of first bit lines and at least one pair of second bit lines, the pair of first bit lines coupled to first memory cells of a first memory cell block, the pair of second bit lines coupled to second memory cells of a second memory cell block, the page buffer circuit comprising:

a first bit line select circuit configured to select one of the first bit lines in response to first discharge signals and first bit line select signals and to couple the selected first bit line to a sensing node;

a second bit line select circuit configured to select one of the second bit lines in response to second discharge signals and second bit line select signals and to couple the selected second bit line to the sensing node;

a sensing circuit configured to sense a voltage of the sensing node in response to a latch control signal and to generate sensing data to a first node according to the sensing result;

a latch circuit configured to latch the sensing data received in a read operation or input data received in a program operation, or both;

a program control circuit configured to output the input data received from the latch circuit to the first or second bit line coupled to the sensing node in response to a first program control signal;

a verify circuit configured to generate verify data in response to a verify control signal and the sensing data received from the latch circuit;

a first voltage sustain circuit configured to maintain one voltage level selected by the first bit line select circuit of the first bit lines to a voltage level of the input data in response to a second program control signal during one program operation of the first memory cells, wherein the first voltage sustain circuit comprises:

a first switching circuit configured to output a first select signal having the selected one voltage level of the first bit lines in response to the second program control signal;

a second switching circuit configured to output a second select signal having the other voltage level of the first bit lines in response to the second program control signal;

a first multiplexer configured to output a first control signal of an internal voltage or ground voltage level in response to the first select signal;

a second multiplexer configured to output a second control signal of the internal voltage or ground voltage level in response to the second select signal;

a first discharge circuit configured to discharge the selected one of the first bit lines to the ground voltage or to stop a discharge operation in response to the first control signal; and a second discharge circuit configured to discharge the other of the first bit lines to the ground voltage or to stop a discharge operation in response to the second control signal; and a second voltage sustain circuit configured to maintain one voltage level selected by the second bit line select circuit of the second bit lines to a voltage level of the input data in response to a third program control signal during one program operation of the second memory cells, wherein during one program operation of the first memory cells, a logic value of the input data output to the first bit line by the program control circuit and a logic value of the input data output to the second bit line by the program control circuit are substantially the same, and wherein when the first bit line select circuit couples one of the first bit lines to the sensing node, the second bit line select circuit separates the second bit lines from the sensing node.

2. The page buffer circuit as claimed in claim 1, further comprising:

a precharge circuit configured to precharge the sensing node to an internal voltage in response to a precharge control signal;

a data input circuit configured to output the input data, which are received through a data I/O node, to the latch circuit through a second node in response to an input control signal; and a latch reset circuit configured to initialize the latch circuit in response to a reset control signal.

3. The page buffer circuit as claimed in claim 1, wherein in the read operation, when one of the first bit lines is coupled to the sensing node, the sensing circuit senses a voltage of the sensing node based on data read from one of the first memory cells in response to the latch control signal, and when one of the second bit lines is coupled to the sensing node, the sensing circuit senses a voltage of the sensing node based on data read from one of the second memory cells in response to the latch control signal.

4. The page buffer circuit as claimed in claim 1, wherein the logic value of the input data output to the first bit line by the program control circuit and the logic value of the input data output to the second bit line by the program control circuit are different from each other.

5. The page buffer circuit as claimed in claim 1, wherein the second voltage sustain circuit comprises:

a first switching circuit configured to output a first select signal having the selected one voltage level of the second bit lines in response to the third program control signal;

a second switching circuit configured to output a second select signal having the other voltage level of the second bit lines in response to the third program control signal;

a first multiplexer configured to output a first control signal of an internal voltage or ground voltage level in response to the first select signal;

a second multiplexer configured to output a second control signal of the internal voltage or ground voltage level in response to the second select signal;

a first discharge circuit configured to discharge the selected one of the second bit lines to the ground voltage or to stop a discharge operation in response to the first control signal; and a second discharge circuit configured to discharge the other of the second bit lines to the ground voltage or to stop a discharge operation in response to the second control signal.

6. The page buffer circuit as claimed in claim 1, wherein the verify circuit comprises:

a first switching circuit that has a first terminal coupled to the sensing node and is turned on or off in response to the verify control signal; and a second switching circuit that has a first terminal coupled to a second terminal of the first switching circuit and is turned on or off in response to the sensing data received from the latch circuit, wherein when the first and second switching circuits are turned on at substantially the same time, the verify data having a voltage level of the sensing node are output from the second terminal of the second switching circuit.

7. A program operation method for a non-volatile memory device including a page buffer circuit and first and second memory cell blocks, the program operation method comprising:

storing first input data in a latch circuit;

when a program voltage is applied to a first word line coupled to a first memory cell included in the first memory cell block, loading the first input data onto a first bit line coupled to the first memory cell through a sensing node;

when the first input data are loaded onto the first bit line, storing second input data in the latch circuit;

when the program voltage is applied to a second word line coupled to a second memory cell included in the second memory cell block, loading the second input data onto a second bit line coupled to the second memory cell through the sensing node, generating first verify data for verifying whether or not the first memory cell has been programmed; and generating second verify data for verifying whether or not the second memory cell has been programmed, wherein the step of loading the second input data comprises:

allowing a second bit line select circuit to couple the second bit line to the sensing node;

outputting the second input data, which are stored in the latch circuit, to the second bit line through the sensing node in response to a first program control signal;

when the program voltage is applied to the second word line, separating the second bit line from the sensing node; and when the second bit line is separated from the sensing node, maintaining a voltage level of the second bit line to a voltage level of the second input data in response to a second program control signal;

wherein the step of maintaining the voltage level of the second bit line comprises:

when the second input data are supplied to the second bit line, outputting a select signal having a voltage level of the second bit line in response to the second program control signal;

generating a control signal having an internal voltage or ground voltage level in response to the select signal; and discharging the second bit line to the ground voltage or stopping a discharge operation in response to the control signal.

8. The program operation method as claimed in claim 7, further comprising:

a first repetition step of repeating the steps of loading the first input data and generating the first verify data until the program of the first memory cell is completed; and a second repetition step of repeating the steps of loading the second input data and generating the second verify data until the program of the second memory cell is completed, wherein the step of loading the first input data of the first repetition step and the step of generating the second verify data of the second repetition step are performed at substantially the same time, and the step of generating the first verify data of the first repetition step and the step of loading the second input data of the second repetition step are performed at substantially the same time.

9. The program operation method as claimed in claim 7, wherein the step of loading the first input data comprises:

allowing a first bit line select circuit to couple the first bit line to the sensing node;

outputting the first input data, which are stored in the latch circuit, to the first bit line through the sensing node in response to a first program control signal;

when the program voltage is applied to the first word line, separating the first bit line from the sensing node; and when the first bit line is separated from the sensing node, maintaining a voltage level of the first bit line to a voltage level of the first input data in response to a second program control signal.

10. The program operation method as claimed in claim 9, wherein the step of maintaining the voltage level of the first bit line comprises:

when the first input data are supplied to the first bit line, outputting a select signal having a voltage level of the first bit line in response to the second program control signal;

generating a control signal having an internal voltage or ground voltage level in response to the select signal; and discharging the first bit line to the ground voltage or stopping a discharge operation in response to the control signal.

11. The program operation method as claimed in claim 7, wherein the step of generating the first verify data comprises:

precharging the sensing node to an internal voltage;

storing the first input data in the latch circuit;

allowing the first bit line select circuit to couple the first bit line to the sensing node;

when a verify voltage is applied to the first word line, sensing a voltage of the sensing node based on data read from the first memory cell in response to a latch control signal, and storing sensing data in the latch circuit according to the sensing result; and outputting the first verify data in response to the sensing data or the first input data, and a verify control signal.

12. The program operation method as claimed in claim 11, further comprising the step of additionally precharging the sensing node to the internal voltage when the first verify data are outputted, wherein in the case where the program of the first memory cell has not been completed, a logic value of the first verify data is based on a voltage of the sensing node.

13. The program operation method as claimed in claim 7, wherein the step of generating the second verify data comprises:

precharging the sensing node to the internal voltage;

storing the second input data in the latch circuit;

allowing the second bit line select circuit to couple the second bit line to the sensing node;

when a verify voltage is applied to the second word line, sensing a voltage of the sensing node based on data read from the second memory cell in response to a latch control signal, and storing sensing data in the latch circuit according to the sensing result; and outputting the second verify data in response to the sensing data or the second input data, and a verify control signal.

14. The program operation method as claimed in claim 13, further comprising the step of additionally precharging the sensing node to the internal voltage when the second verify data are outputted, wherein in the case where the program of the second memory cell has not been completed, a logic value of the second verify data is based on a voltage of the sensing node.

* * * * *